United States Patent

Seidel

[15] 3,649,927

[45] Mar. 14, 1972

[54] FEED-FORDWARD AMPLIFIER

[72] Inventor: Harold Seidel, Warren, N.J.

[73] Assignee: Bell Telephone Laboratories, Incorporated, Murray Hill, Berkeley Heights, N.J.

[22] Filed: Feb. 27, 1970

[21] Appl. No.: 15,002

[52] U.S. Cl. ..............................................330/124, 330/149
[51] Int. Cl. ............................................................H03f 3/68
[58] Field of Search ....................330/124, 149, 151; 325/65, 325/474–476; 333/10; 328/163

[56] References Cited

UNITED STATES PATENTS 2,592,716 4/1952 Lewis ................................330/151 X

*Primary Examiner*—Roy Lake
*Assistant Examiner*—James B. Mullins
*Attorney*—R. J. Guenther and Arthur J. Torsiglieri

[57] ABSTRACT

The parameters of a feed-forward compensated amplifier are redefined such that the error correcting signal and the uncorrected signal combine in phase at maximum output power. It is then shown that for this condition a directional coupler can be used as the error injection network with minimal loss of error signal power or main signal power. This results in the most efficient use of both the main signal amplifier and the error signal amplifier and, in addition, produces an impedance match in the main signal wavepath, in the error signal wavepath and at the output terminal of the overall amplifier.

2 Claims, 9 Drawing Figures

INVENTOR
H. SEIDEL
BY
Sylvan Sherman
ATTORNEY

FEED-FORDWARD AMPLIFIER

This application relates to feed-forward amplifiers.

BACKGROUND OF THE INVENTION

In U.S. Pat. No. 3,471,798, and in my copending application Ser. No. 819,247, filed Apr. 25, 1969, and assigned to applicant's assignee, feed-forward compensated amplifiers are described wherein the amplified signal, derived from a main signal amplifier, is compensated with a time-shifted reference signal, such that error components present in the amplified signal are isolated. The error components, which include both noise and distortion components introduced by the main amplifier, are then amplified by means of an auxiliary amplifier, and added, in turn, to the time-shifted amplified signal in such phase as to minimize the net error in the output signal.

One of the more difficult problems associated with the design of feed-forward compensated amplifiers has been the realization of an efficient error injection network. It is the latter network which injects the relatively low level error signal into the relatively high level main signal wavepath. In addition to injecting the error signal in the correct phase, the injection network must isolate the auxiliary amplifier from the high power main signal and, at the same time, couple the error signal into the main signal path with minimum loss to both the error signal and to the main signal. Advantageously, it should also provide an impedance match for both the main signal path and the error signal path.

In my above-identified Pat. 3,471,798, a compromise was struck among these various conflicting requirements by the use of a transformer, connected as a three-port. Such a network, however, does not provide the desired impedance match. Accordingly, in my above-identified application, a directional coupler is employed. However, as was recognized in said application, the use of a coupler in the manner described resulted in loss of main signal power and loss of error signal power.

It is, accordingly, the broad objective of the present invention to redefine the operating parameters of a feed-forward amplifier in order to derive maximum efficiency from the error injection network in such amplifiers.

SUMMARY OF THE INVENTION

In general, there are two interacting, but very differently weighted, types of distortion products formed in an amplifier. They are observed, respectively, as a compression effect which, typically, reduces the amplitude of the output signal; and as an intermodulation effect which creates new signal components at frequencies that are different from the input signal frequency. The first of these effects represents a coherent error, characterized by a first order error voltage. The second effect represents a non-coherent error and is of the second order. In the description that follows, only the compression error component will be considered because of the orders of magnitude involved. However, it should be noted that the feed-forward system inherently corrects both types of error simultaneously.

In accordance with the present invention, the error injection network of a feed-forward amplifier comprises a directional coupler energized such that the coherent error correcting signal and the uncorrected main signal combine in phase in the output port of the coupler at some specified, high signal level. Typically, this adjustment is made at maximum output signal. Under this preferred condition, all of the main amplifier output power and all of the error amplifier output power combine, with minimal loss, in the output terminal of the amplifier. In addition to maintaining an impedance match at all times in the main signal wavepath, in the error signal wavepath, and at the output terminal of the feed-forward amplifier, such an arrangement tends to reduce the maximum power that must be supplied by the error amplifier. This permits an improvement in the qualities of the error amplifier and a corresponding improvement in the overall properties of the feed-forward amplifier.

These and other objects and advantages, the nature of the present invention, and its various features, will appear more fully upon consideration of the various illustrative embodiments now to be described in detail in connection with the accompanying drawings.

DETAILED DESCRIPTION

Figure 1:
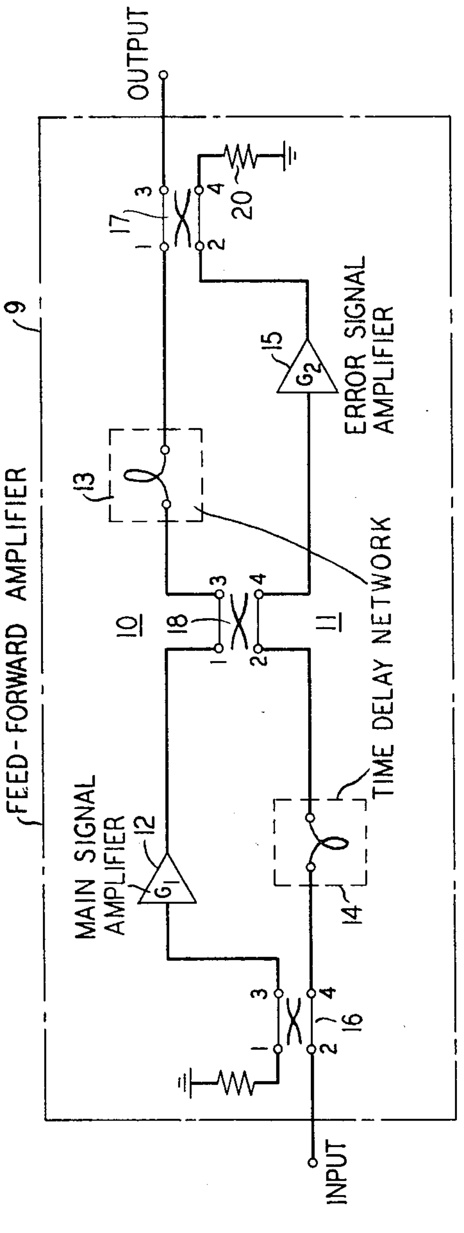
FIG. 1 shows a feed-forward amplifier in accordance with the present invention.

Referring to the drawings, FIG. 1 shows a feed-forward amplifier 9, in accordance with the present invention, comprising two parallel wavepaths 10 and 11. The first, or main signal wavepath 10 includes, in cascade, a main signal amplifier 12 and a time delay network 13. The second or error signal wavepath 11 includes, in cascade, a second time delay network 14 and an error signal amplifier 15.

At the input end of amplifier 9 a first directional coupler 16 divides the input signal into two components, and couples a different one of the two components to each of the two wavepaths 10 and 11. At the output end of amplifier 9, a second directional coupler 17 couples the signal from error signal amplifier 15 into the main signal wavepath to produce the corrected output signal.

A third directional coupler 18 couples a portion of the amplified output signal from amplifier 12 to the input of error amplifier 15.

In operation, the input signal to be amplified is divided by coupler 16 into two components. One component is coupled to the main amplifier 12 and is amplified. The other component is coupled into wavepath 11 and is the reference signal with which the portion of the amplified signal derived from amplifier 12 is compared. This comparison is made by coupling a portion of the amplified signal from wavepath 10 into wavepath 11 by means of coupler 18, and subtracting, from this coupled portion, the reference signal. If there is no distortion introduced by amplifier 12, the difference, or error signal thus formed, is zero. If, on the other hand, distortion components are present, a net error signal is produced at the input to error amplifier 15. This error signal is then amplified and injected back into the main signal wavepath by means of output coupler 17 in a manner to minimize the net distortion in the output signal. The amplitude, time delay and phase of the respective signal components are adjusted by means of networks 13 and 14 and suitably located phase shifters, not shown.

As was pointed out in Pat. 3,471,798, and in my above-identified application, the use of a directional coupler 17 as the error injection network at the output end of the amplifier results in a portion of the error correcting signal and a portion of the amplified main signal being dissipated in the resistive termination 20 connected to port 4 of coupler 17. It is the objective of the present invention to redefine the parameters of feed-forward amplifier 9 so as to reduce this loss at the higher power levels where the demands upon the error amplifier are severest. The basis upon which this redefinition of parameters is predicated relates to the nature of the distortion produced in the main amplifier, as will now be explained.

Figure 2:
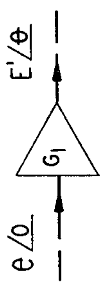
FIG. 2 shows the main signal amplifier of the feed-forward amplifier of FIG. 1.
Figure 3:
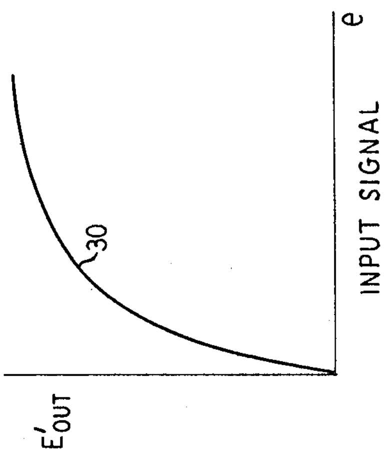
FIGS. 3 and 4 show the amplitude and phase distortion, respectively, of the main signal amplifier of FIG. 2.

Referring again to the drawings, FIG. 2, included for purposes of explanation, shows main amplifier 12 to which there is applied an input signal $e\angle 0$ and which produces, in turn, an output signal $E\angle\theta$. At low signal levels, incremental increases in the input signal produce proportionate incremental increases in the output signal. However, all amplifiers tend to saturate as the input signal is increased such that incremental increases in the input signal at these higher levels produce smaller and smaller incremental increases in the resulting output signal. This saturation effect is indicated by the typical input-output amplifier characteristic curve 30, shown in FIG. 3, which increases linearly over an interval at the lower input signal levels, but tends to flatten out at the higher input levels.

Figure 4:
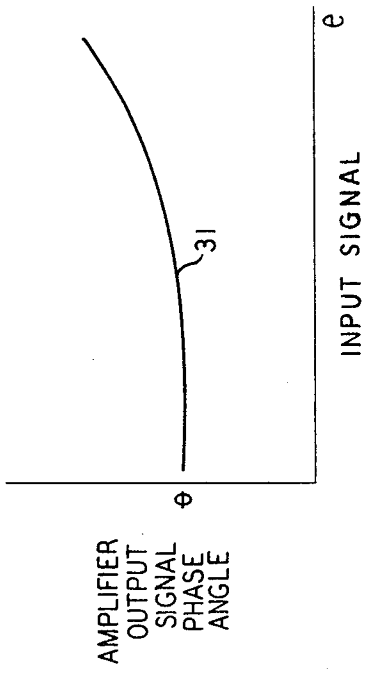

In addition, there is also a corresponding change in the relative phase between the input and output signals. This is indicated by curve 31 in FIG. 4 which shows the variation of the output signal phase angle as a function of the input signal level. At low levels, the relative phase angle is $\theta$. As the amplitude of the input signal increases, the phase angle tends to change. While an increasing phase angle is indicated in FIG. 4, the change can, alternately, result in a decreasing phase angle, depending upon the nature of the amplifier.

Figure 5A:
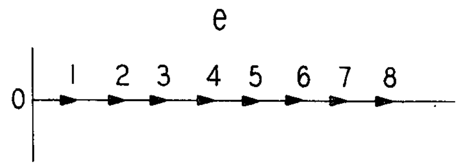
FIGS. 5A and 5B are vector representations of the distortion depicted in FIGS. 3 and 4.
Figure 5B:
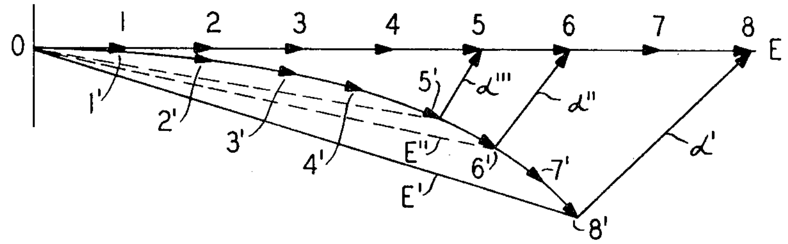

FIGS. 5A and 5B are vector diagrams illustrating the distortion effects represented by curves 30 and 31. In particular, FIG. 5A shows eight incremental increases 1–8 in the level of input signal $e$. FIG. 5B shows eight proportionate incremental increases 1–8 in the amplitude of the output signal of an ideal amplifier to produce an undistorted output signal E. The output represented by E is undistorted in that the incremental increases 1–8 are all equal in amplitude and have the same phase angle. In practice, however, the actual incremental increases 1′–8′ will not be equal in either amplitude or phase. Hence, these are shown to have decreasing amplitudes and changing relative phases. The actual output signal E′ is then given by the sum of the vectors 0—1′, 1′—2′...et cetera. The actual output signal at maximum input signal is given by the vector sum of all increments 1′–8′, and is represented in FIG. 5B by vector E′. The vector difference $\alpha'$ between the undistorted output signal E and the actual output signal E′ represents the maximum distortion introduced by the amplifier.

In the prior art feed-forward amplifiers, described in my above-identified patent and in my copending application, the circuit parameters are selected with respect to the low level gain characteristic of the main amplifier. That is, the low level gain and the low level phase of the main amplifier are accepted as the criteria against which error is measured. Any deviation in gain or phase as the signal level increases is regarded as an error, and an appropriate error correcting signal is injected into the main signal wavepath. This error signal is added to the actual signal to produce the corrected output signal. Thus, referring again to FIG. 5B, at the lowest levels shown, the actual signal 1′ and the undistorted signal 1 are essentially equal, resulting in no error correcting signal. As the input signal increases to level 6, for example, an error signal vector $\alpha''$ must be added to output signal E″ to produce the corrected output signal 6. Similarly, at level 8′, an error correcting signal $\alpha'$ is required to produce the corrected output signal 8. In each instance, the correction reestablishes the signal phase corresponding to the low level signal phase represented by low level signals 1 and 1′. It can be readily shown however, that for this condition of correction, the error amplifier power is being inefficiently utilized in that a portion of the power it produces is inevitably lost in resistive termination 20 connected to port 4 of output coupler 17.

As a result of this power loss in the output coupler, the net power output from a feed-forward amplifier is reduced. While this lost output can be recovered by increasing the power output from the error amplifier, it will be recalled that it is the qualities of the error amplifier that define the overall quality of the feed-forward amplifier as a whole. Accordingly, the error amplifier is advantageously a low power, high quality amplifier. Thus, while the power output capacity of the error amplifier can be increased to meet the output requirements of the feed-forward amplifier, to do so would tend to compromise the error amplifier and, in turn, to compromise the total amplifier. Furthermore, it only masks the problem but does not solve it.

Figure 6:
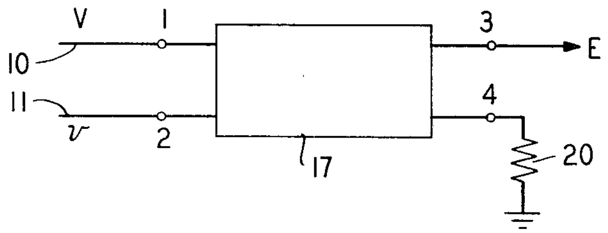
FIG. 6 shows the output coupler of the feed-forward amplifier of FIG. 1.

The present invention seeks to avoid these limitations by redefining the reference standard against which error is measured. In particular, the error reference is established with respect to conditions at some specified high level, such as maximum power output, rather than with respect to conditions at the lower power levels, as was done heretofore. Thus, referring to FIG. 6, the signals acting upon output coupler 17, and the coupler parameters are examined and defined at output signal level 8 shown in FIG. 5B, which, for the purposes of the present discussion, shall be considered to correspond to maximum output power from the main amplifier. Before proceeding with this discussion, however, the properties of a passive, reactive, reciprocal four-port coupler will be briefly reviewed. Designating ports 1—2, and 3—4 as the conjugate pairs of ports, the scattering matrix M of the coupler is given by $$M = \begin{vmatrix} 0 & 0 & S_{13} & S_{14} \\ 0 & 0 & S_{23} & S_{24} \\ S_{31} & S_{32} & 0 & 0 \\ S_{41} & S_{42} & 0 & 0 \end{vmatrix}$$

where the generalized designation $S_{ij}$ denotes the coupling between the $i^{th}$ and the $j^{th}$ port. Since the coupler is a reactive, reciprocal network, $S_{ij}=S_{ji}$ and, more particularly, $$|S_{13}|=|S_{31}|=|S_{24}|=|S_{42}|=|t|, \qquad (1)$$

where $t$ is the coefficient of transmission of the "through" signal component; and $$|S_{14}|=|S_{41}|=|S_{23}|=|S_{32}|=|k|, \qquad (2)$$

where $k$ is the coefficient of coupling of the "coupled" signal component.

If coupler 17 is, in addition, bisymmetric, the matrix coefficients given by each of equations 1 and 2 are equal in phase, as well as in magnitude. If the coupler is asymmetric, there will be a phase difference associated with some of the coefficients.

Since, for such a four-port $MM^*=1$ (where the asterisk designates the conjugate of the term so marked), it follows, generally, that $$\sum_{j=1}^{4} S_{ji}^* S_{jk} = \delta_{ik} \qquad (3)$$

where $\delta_{ik}=0$ when $i \quad k$
and $\delta_{ik}=1$ when $i=k$.

This, typically, gives rise to a number of useful relationships among the scattering coefficients including, but not limited to:

$$S_{13}S_{13}^*+S_{23}S_{23}^*=1 \qquad (4)$$

from which it follows that $$|S_{13}|^2+|S_{23}|^2=1. \qquad (5)$$

Also, for example, $$S_{13}^*S_{14}+S_{23}^*S_{24}=0 \qquad (6)$$

and $$S_{13}S_{23}^*+S_{14}S_{24}^*=0 \qquad (7)$$

Referring again to FIG. 6, it is now postulated that, with each amplifier operating at its maximum output power, all of the incident power associated with the main wavepath signal V, coupled to port 1 of coupler 17, and that all of the incident power associated with the error correcting signal $v$, coupled to port 2, combine in output port 3 to produce output signal E, and that none of this power be dissipated in the resistive termination 20 connected to coupler port 4.

Expressing the two conditions specified hereinabove in terms of the several signals, gives $$VS_{13}+vS_{23}=E \quad (8)$$

and $$VS_{14}+vS_{24}=0 \quad (9)$$

Solving for $v$ in equation 9 and substituting in equation 8, we find that $$v=-V(S_{14}/S_{24}) \quad (10)$$

and $$VS_{13}-(VS_{23}S_{14}/S_{24})=E \quad (11)$$

Multiplying the numerator and denominator of the second term of equation 11 by $S_{24}^*$, we obtain $$VS_{13}-(VS_{23}(S_{14}S_{24}^*)/S_{24}S_{24}^*)=E \quad (12)$$

Substituting for $S_{14}S_{24}^*$ from equation 7, and noting that $S_{ij}S_{ij}^*=|S_{ij}|^2$, we obtain $$VS_{13}+VS_{13}\frac{|S_{23}|^2}{|S_{24}|^2}=E, \quad (13)$$

which simplifies to $$VS_{13}=E|S_{24}|^2. \quad (14)$$

Recognizing that $VS_{13}$ is that component of the main wavepath signal coupled to output port 3, corresponding to signal E' in FIG. 5B, and noting that $|S_{24}|^2$ is a real number, equation 14 states that E' and output signal E are in phase.

The component of the error correcting signal coupled to port 3 is derived by substituting $E|S_{24}|^2$ for $VS_{13}$ in equation 8 and solving for $vS_{23}$. This gives $$vS_{23}=E-E|S_{24}|^2, \quad (15)$$

or $$vS_{23}=E(1-|S_{24}|^2)=E|S_{14}|^2. \quad (16)$$

Figure 7:
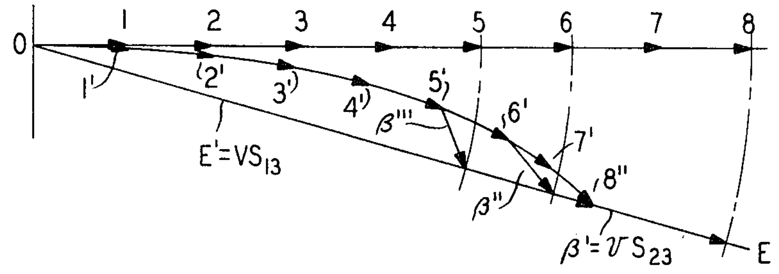
FIG. 7 shows the phases of the signals in the output coupler of FIG. 6.

Noting that $|S_{14}|^2$ is also a real number, equation 16 states that the error correcting signal $vS_{23}$ (corresponding to $\alpha'$ in FIG. 5B) is also in phase with output signal $E$. The new signal relationships, defined by equations 14 and 16, are illustrated in FIG. 7 which includes, as in FIG. 5B, the undistorted signal increments 1-8 and the actual signal increments 1'-8'. In FIG. 7, however, the error correcting signal $\beta'=vS_{23}$ is now added in phase to signal $E'=VS_{13}$ to obtain the corrected output signal $E$. This, obviously, is distinctly different than the mode of operation shown in FIG. 5B wherein the error correcting signal $\alpha'$ and the resulting, corrected output signal $E$ are not in phase. This in-phase requirement means that, in accordance with the present invention, the reference phase angle against which phase error is measured is defined by the phase of the highest level output signal 8', rather than by the phase angle of the low level signal 1, as in the prior art.

To obtain a measure of the magnitude of the error correcting signals at the intermediate signal levels 1-7, arcs are struck along vector $E'$ (extended, if necessary,) with radii 1 through 7, and vectors drawn between points 1', 2'...7' and the corresponding points 1, 2...7 along vector $E'$. For purposes of illustration, two such vectors $\beta''$ and $\beta'''$ at levels 5 and 6 are shown in FIG. 7.

It will be noted, by reference to FIGS. 7 and 5B, that at least at the higher signal levels, the error correcting signals, as represented by the above-constructed $\beta'$, $\beta''$ and $\beta'''$ vectors, are smaller than the corresponding error correcting signals represented by the $\alpha'$, $\alpha''$ and $\alpha'''$ vectors required to reestablish the low level signal phase. This means that for the same corrected output signal, the error amplifier can now be smaller. Or, conversely, for the same size error amplifier, a larger output signal can be obtained. At the lower signal levels, correction in accordance with the prior art may require less correction power, but at these relatively low levels the amount of power, in either instance, is small and well below the power capabilities of the error amplifier.

To summarize, in a feed-forward amplifier, in accordance with the present invention, the error injection network is a directional coupler having two pairs of conjugate ports 1—2 and 3—4. With the signal in the main signal wavepath coupled to port 1, and the error correcting signal coupled to port 2, all of the wave energy is coupled to the output port 3, to produce the maximum, corrected output signal E, when the main wavepath signal component $V$ and error correcting signal $v$ are given by $$V=\frac{E|S_{24}|^2}{S_{13}}=ES_{13}^* \quad (17)$$

and $$v=\frac{E|S_{14}|^2}{S_{23}}=ES_{23}^* \quad (18)$$

where $v$ is the error amplifier signal at maximum output from the main signal amplifier.

Having fully defined the output coupler and the signals to be applied thereto, the remainder of this discussion will consider the practical aspects of the design of a feed-forward amplifier and, in particular, the design of the rest of the amplifier in order to satisfy the above-defined conditions.

DESIGN OF OUTPUT COUPLER 17

In practice, a feed-forward amplifier is designed about the available amplifiers. That is, we start with a particular main amplifier, having a specified maximum output power $P_m$, and an auxiliary, or error amplifier which also has a known maximum output power $P_\epsilon$. To a first approximation, the power coupled to the output coupler from the main signal wavepath is equal to $P_m$. The power coupled to the output coupler from the error amplifier is $P_\epsilon$. Since all of the incident power is coupled to the output port, the total maximum output power is $$P_o=P_\epsilon+P_m \quad (19)$$

The ratio of the main amplifier signal $V$, to the error correcting signal $v$ is, from equations 17 and 18 given by $$V/v=-S_{13}^*/S_{23}^* \quad (20)$$

The coupler parameters are then defined with respect to the power ratio $P_m/P_\epsilon$ by $$\frac{P_m}{P_\epsilon}=\frac{V^2}{v^2}=\frac{|S_{13}|^2}{|S_{23}|^2}, \quad (21)$$

where $$|S_{13}|^2+|S_{23}|^2=1. \quad (22)$$

Equations 21 and 22 fully define the output coupler parameters in terms of the maximum available power from the main amplifier and from the error amplifier.

DESIGN OF INPUT COUPLER 16

As indicated in my above-identified patent, in a feed-forward amplifier, it is the noise figure of the error amplifier that dominates the overall noise figure of the feed-forward amplifier. For this reason, the input coupler is advantageously designed to couple the major portion of the input signal into the error amplifier wavepath 11, rather than into the main amplifier wavepath 10. In particular, it can be shown that the overall relative noise temperature $t$ of a feed-forward amplifier is given approximately by $$t=\left(\frac{1}{|m_{24}|^2}-1\right)+t_\epsilon\frac{|s_{24}|^2}{|m_{24}|^2} \quad (23)$$

where

- $t_\epsilon$ *is the relative noise temperature of the error amplifier;*
- $m_{24}$ is the scattering coefficient which defines the coupling between ports 2 and 4 of coupler 16;

and

- $s_{24}$ is the scattering coefficient which defines the coupling between ports 2 and 4 of coupler 18.

Typically, coupler 18 is a 20 to 30 db. coupler and, hence, the magnitude of $s_{24}$ is very close to unity. Making this substitution, equation 23 reduces to $$t\approx\frac{1+t_\epsilon}{|m_{24}|^2}-1. \quad (24)$$

Equation 24 states that if all of the input signal is coupled into wavepath 11, i.e., $m_{24}=1$, the overall noise temperature $t$ is equal to $t_\epsilon$, *which is the optimum noise temperature that can be realized. Obviously, some of the input signal must be coupled to the main amplifier. However, since main amplifier gain is usually not difficult to realize, the input coupler is designed more with a view to the noise figure than amplifier gain. Thus, as an example, let us assume that a* 20 percent increase in relative noise temperature is considered tolerable. From equation 24 we get $$t=\frac{1+t_\epsilon}{|m_{24}|^2}-1=1.2t_\epsilon. \qquad (25)$$

or $$|m_{24}|=\sqrt{\frac{1+t_\epsilon}{1+1.2t_\epsilon}}. \qquad (26)$$

Since $$|m_{14}|^2+|m_{24}|^2=1, \qquad (27)$$

equations 26 and 27 fully define the input coupler 16.

As an example, let us assume a relative noise temperature of 5 for the error amplifier. Substituting in equations 26 and 27 gives $m_{24}=6/7$ and $m_{14}=1/7$. The latter corresponds to 8.45 db. Typically, a 10 db. coupler would be used.

A measure of the improvement in the noise figure that can be realized by means of feed-forward is given by comparing the noise temperature of 6, obtained in the illustrative example, with the relative noise temperature of 1,000 that would be obtained if, for example, the main signal amplifier is a traveling wave tube used by itself.

GAIN OF ERROR AMPLIFIER 15

To determine the gain, $G_2$, of the error amplifier, a unit distortion signal is assumed to issue from the main amplifier in the absence of an input signal. Being all error, such a signal produces no output signal. Hence, loop balance requires that $$s_{13}S_{13}+s_{14}S_{23}G_2=0 \qquad (28)$$

where $s_{ij}$ is the generalized scattering coefficient of coupler 18.

Solving for $G_2$ gives $$G_2=-(s_{13}S_{13}/s_{14}S_{23}) \qquad (29)$$

The input signal $v_\epsilon$ *to the error amplifier is*

$$v_\epsilon=v/G_2 \qquad (30)$$

Substituting for $v$ and $G_2$, from equations 18 and 29, we obtain $$v_\epsilon=\frac{ES_{23}^*}{-\left(\frac{s_{13}S_{13}}{s_{14}S_{23}}\right)} \qquad (31)$$

or $$v_\epsilon=-E|S_{23}|^2\cdot\frac{s_{14}}{s_{13}}\cdot\frac{1}{S_{13}}. \qquad (32)$$

DESIGN OF COUPLER 18

Figure 8:
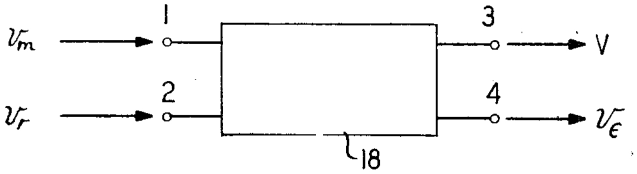
FIG. 8 shows coupler 18 of the feed-forward amplifier of FIG. 1 and the signals applied thereto.

FIG. 8 is a free-body diagram of coupler 18, showing the input signals $v_m$ and $v_r$ applied to ports 1 and 2, respectively, and the output signals $V$ and $v_\epsilon$ *derived from ports 3 and 4, respectively. Assuming a unit input signal, the output signal* $v_m$ derived from main amplifier 12 is given by $$v_m=m_{23}G_1 \qquad (33)$$

where $m_{ij}$ is the generalized scattering coefficient of input coupler 16, and $G_1$ is the main amplifier gain at maximum output power.

$v_r$, the reference signal is simply $$v_r=m_{24} \qquad (34)$$

The relationship between the input and output signals for coupler 18 are $$v_m s_{13}+m_{24}s_{23}=V=ES_{13}^* \qquad (35)$$

and $$v_m s_{14}+m_{24}s_{24}=v=-(E|S_{23}|^2 s_{14}/s_{13}S_{13}) \qquad (36)$$

from which we derive that $$v_m=\frac{-E}{s_{13}S_{13}}[1-|S_{13}|^2-|s_{13}|^2] \qquad (37)$$

Substituting for $v_m$ in equation 35, gives $$E=m_{24}S_{13}/s_{23}^* \qquad (38)$$

which, when inserted in equation 37 yields $$v_m=\frac{-m_{24}}{s_{23}s_{13}^*}[|s_{23}|^2-|S_{13}|^2]. \qquad (39)$$

Substituting for $v_m$ from equation 33 and solving for $s_{23}$ we obtain the approximate solution $$|s_{23}|^2\approx\frac{1}{\frac{|m_{23}G_1|^2}{|m_{24}|^2|S_{13}|^4}+\frac{2-|S_{13}|^2}{|S_{13}|^2}} \qquad (40)$$

is derived.

Also recalling that $$|s_{13}|^2+|s_{23}|^2=1, \qquad (41)$$

equations 40 and 41 fully define coupler 18 in terms of $S_{13}$ of coupler 17; $G_1$, the power gain of the main amplifier at maximum output; and $m_{23}$ and $m_{24}$ of coupler 16, all of which are known.

SUMMARY

Optimum utilization of the main signal amplifier and error amplifier of a feed-forward amplifier are realized by using a directional coupler as the error injection network and adjusting the amplifier parameters such that the main signal and the error correcting signal combine in phase in the output port of the coupler at maximum output signal. The design of the feed-forward amplifier to establish the optimum signal relationships is given. It will be appreciated, however, that the above-described arrangement is merely illustrative of one of the many specific embodiments which can represent applications of the principles of the invention. Numerous and varied other arrangements can readily be devised in accordance with these principles by those skilled in the art without departing from the spirit and scope of the invention.

What is claimed is:

1. A feed-forward amplifier for electromagnetic wave signals comprising:
   - first and second parallel wavepaths:
   - the first of said wavepaths including, in cascade, a main signal amplifier and a first time delay network;
   - the second of said wavepaths including, in cascade, a second time delay network and an error amplifier;
   - means for dividing an input signal into two signal components, and for coupling a different one of said components to the input end of each of said wavepaths;
   - means for coupling a portion of the output from said main signal amplifier to the input of said error amplifier;
   - and an error injection network comprising a directional coupler for combining the signal in said two wavepaths in time and phase to minimize error components in the amplifier output signal;
   - characterized in that:
   - the parameters of said dividing means, said coupling means and said injection network are proportioned such that all of the signal energy from said two wavepaths combine in phase in the output port of said coupler at some specified high level output signal.

2. The feed-forward amplifier according to claim 1 wherein:
   - said coupler has two pair of conjugate ports 1-2 and 3-4;
   - the signal in said first wavepath is coupled to port 1;
   - the signal in said second wavepath is coupled to port 2;
   - the output signal is obtained from port 3;
   - and wherein the coupler parameters $S_{13}$ and $S_{23}$ are given by $$\frac{|S_{13}|^2}{|S_{23}|^2}=\frac{P_m}{P_\epsilon}$$

where $P_m$ is the maximum power output from said main signal amplifier:

$P_\epsilon$ is the maximum power output from said error amplifier; and $|S_{13}|^2+|S_{23}|^2=1$.

* * * * *